United States Patent [19]

Maeda et al.

[11] Patent Number: 5,064,778

[45] Date of Patent: Nov. 12, 1991

[54] VAPOR-PHASE EPITAXIAL GROWTH METHOD

[75] Inventors: Takayoshi Maeda, Mie; Masahiko Hata, Osaka; Noboru Fukuhara, Osaka; Tadeshi Watanabe, Osaka, all of Japan

[73] Assignee: Sumitomo Chemical Co., Ltd., Osaka, Japan

[21] Appl. No.: 472,153

[22] Filed: Jan. 30, 1990

[30] Foreign Application Priority Data

Jan. 30, 1989 [JP] Japan ................................ 1-22244
Mar. 6, 1989 [JP] Japan ................................ 1-54438

[51] Int. Cl.$^5$ ............................................ H01L 21/20
[52] U.S. Cl. ..................................... 437/81; 437/225; 437/234; 148/33; 148/DIg. 110; 148/DIG. 65
[58] Field of Search ................... 437/225, 234, 5, 81; 148/DIG. 65, DIG. 110, 33

[56] References Cited

U.S. PATENT DOCUMENTS 4,895,737 1/1990 Griffiths et al. ..................... 437/225
4,935,381 6/1990 Speckman et al. ....... 148/DIG. 110
4,980,204 12/1990 Fujii et al. ........................... 437/234

OTHER PUBLICATIONS

S. J. Bass, "Growth of Semi-Insulating Epitaxial Gallium Arsenide by Chromium Doping in the Metal-Alkyl+Hydride System", Journal of Crystal Growth, vol. 44, (1978), pp. 29-36.

T. Nakanishi et al., "Growth of High-Purity GaAs Epilayers by MOCVD and their Applications to Microwave MESFET's", Journal of Crystal Growth, vol. 55, (1981), pp. 255-262.

H. M. Cox et al., "Characteristics of an AsCl3/Ga/H2 Two-Bubbler GaAs CVD System for MESFET Applications", Inst. Phys. conf. Ser., No. 33b, (1977), Chap. 1, pp. 11-22.

The 46th Ohyo Butsuri Gakkai Yokoshu, 2a-E-3, (1985) (translation attached).

M. Hata et al., "Residual Impurities in Epitaxial Layers Grown by MOVPE", Journal of Crystal Growth, No. 93, 1988, North-Holland, Amsterdam (NL), pp. 543-549.

Primary Examiner—Brian E. Hearn
Assistant Examiner—Trung Dang
Attorney, Agent, or Firm—Sughrue, Mion, Zinn, Macpeak & Seas

[57] ABSTRACT

A vapor-phase epitaxial growth method for producing a Groups III-V compound semiconductor containing arsenic by vapor-phase epitaxial growth using arsenic trihydride as an arsenic source is disclosed, wherein said arsenic trihydride has a volatile impurity concentration of not more than 1.5 molppb on a germanium tetrahydride conversion. The resulting epitaxial crystal has a low residual carrier concentration and is applicable to a field effect transistor.

4 Claims, 4 Drawing Sheets

VAPOR-PHASE EPITAXIAL GROWTH METHOD

FIELD OF THE INVENTION

This invention relates to a vapor-phase epitaxial growth method (this method being hereinafter sometimes referred to as "vapor-phase growth method"), in which a Groups III-V compound semiconductor containing arsenic is epitaxially grown in the vapor phase using a volatile compound of the Group III (according to Mendelejeff's periodic table, hereinafter the same) element and a volatile compound of the Group V element containing arsenic, wherein arsenic trihydride (hereinafter referred to as arsine) is used as an arsenic source. It also relates to a field effect transistor (hereinafter abbreviated as FET) comprising a semiconductor substrate having thereon a GaAs or $Al_xGa_{1-x}As$ (wherein $0<x<1$) epitaxial crystal grown by metalorganic vapor-phase growth as a buffer layer.

BACKGROUND OF THE INVENTION

Groups III-V compound semiconductors, e.g., GaAs, $Al_xGa_{1-x}As$, $GaAs_xP_{1-x}$, $In_xGa_{1-x}As$, and $In_xGa_{1-x}As_yP_{1-y}$, are extremely useful as materials for Gunn diodes, ultra-high speed semiconductor devices, light-emitting devices, etc., and the demand therefor has recently been considerably increasing. Compound semiconductor epitaxial crystals for these devices are produced by vapor-phase growth, molecular beam epitaxial growth, and liquid-phase growth. In particular, the vapor-phase growth method is attracting attention as an industrial method applicable to mass production.

Known techniques of vapor-phase growth of Groups IIIV compound semiconductors include (1) a metalorganic chemical vapor deposition (hereinafter referred to as MOCVD) method in which an alkyl compound of the Group III element and a hydride or alkyl compound of the Group V element are heat decomposed, (2) a hydride method using a chloride of the Group III element and a hydride of the Group V element, and (3) a chloride method using a chloride of the Group III element and a chloride of the Group V element. In the production of compound semiconductors containing arsenic by the MOCVD method and hydride method, arsine is widely used as a source of arsenic. By combining arsine with an alkyl compound of the Group III element in the MOCVD method or with a chloride of the Group III element in the hydride method, it is possible to grow a crystal exhibiting satisfactory light emission characteristics and, hence, industrial production of light-emitting devices, such as semiconductor lasers and light-emitting diodes has already been put into practice.

In particular, GaAs and $Al_xGa_{1-x}As$ (wherein $0<X<1$) compound semiconductors are of extreme use as materials of ultra-high speed FET devices, and the demand therefor has recently been increasing in the field of various amplifiers and high-speed integrated circuits. FET devices for these applications are generally produced by processing a GaAs or $Al_xGa_{1-x}As$ crystal layer formed on a semi-insulating single crystal substrate through epitaxial growth so as to have prescribed carrier concentration, thickness and composition. The epitaxial crystal to be used in the FET device is produced by vapor-phase growth, molecular beam epitaxial growth or liquid-phase growth. In particular, the MOCVD method using an organic metal and arsine as raw materials has been attracting attention as an industrially applicable mass-production method. In the production of an epitaxial crystal for, for instance, a high electron mobility transistor (hereinafter abbreviated as HEMT) which has been recently noted as one of ultra-high speed FET according to the MOCVD method, arsine, trimethylgallium, trimethylaluminum, and a dopant gas are successively supplied onto a heated substrate of a GaAs single crystal and heat decomposed to form a non-doped GaAs layer (about 0.5 μm thick), a non-doped $Al_{0.3}Ga_{0.7}As$ layer (0.001 to 0.02 μm thick), an N-type $Al_{0.3}Ga_{0.7}As$ layer (0.03 to 0.05 μm thick), and an N-type GaAs crystal (0.05 to 0.15 μm thick) through epitaxial growth in a successive manner to thereby obtain a crystal having a prescribed structure. Epitaxial crystals applicable to the other FET devices can be prepared in a similar manner. Since the crystal thickness and composition are easily and precisely controllable by adjusting flow rates of raw material gases, the MOCVD method is expected as an advantageous technique of crystal growth for FET.

However, the conventional vapor-phase growth method using arsine as a Group V source has poor reproducibility in the formation of epitaxial crystals for use particularly in high-speed electronic devices requiring a high purity layer with a low impurity concentration. For example, in an FET used as an amplifier in the ultra-high frequency band, an N-type GaAs crystal active layer having an electron concentration of from about 1 to $2\times10^{17}/cm^3$ is formed on a semi-insulating substrate, and a high purity buffer layer having a thickness of from about 0.2 to 5 μm is usually inserted between the substrate and the active layer as described in *Gallium Arsenide And Related Compounds* (1976), *Institute of Physics Conference Series*, No. 33b, pp. 11-12. In order to prevent impurities in the substrate from exerting adverse influences on the active layer and to reduce a leakage current through the buffer layer, the buffer layer must be comprised of a high resistance crystal having a carrier concentration arising from residual impurities of not more than about $2\times10^{14}/cm^3$. Where the crystal for FET is allowed to grow by the MOCVD method, however, despite the crystal growth conditions so selected as to minimize the carrier concentration of the buffer layer, it has been difficult to decrease it below $2\times10^{14}cm/^3$, which is considered to constitute a cause of inferiority in FET characteristics. This has placed a hindrance to industrial utilization of crystals obtained by the MOCVD method in FET for low noise amplifiers. Similarly, in the case of applying the crystals to high-output FET for power, FET for integrated circuits, etc., reduction in power efficiency and scatter of threshold voltage which are considered attributed to the shortage of buffer layer resistivity have been pointed out. In order to solve these problems, it has been attempted to add a dopant forming a deep level in the forbidden band of the growing buffer layer crystal to thereby reduce the residual carrier concentration by impurity compensation as taught in *Journal of Crystal Growth*, Vol. 44, pp. 29-36 (1978). However, satisfactory characteristics have not yet been attained due to influences from the deep level formed by the compensating dopant which is introduced into the buffer layer in a large quantity and due to transfer of the compensating dopant to an active layer which is subsequently formed on the buffer layer.

From the viewpoint of vapor-phase growth, a silicon impurity in the organic metal raw material is known as one of causes of the high residual carrier concentration in non-doped crystals formed by the MOCVD method and, hence, reduction of a silicon impurity in the raw material has been studied for improving crystal characteristics as described in *Journal of Crystal Growth*, Vol. 55, pp. 255-262 (1981). Nevertheless, even those crystals prepared from an organic metal whose impurity chiefly comprising silicon has been considerably reduced still suffer from scattering of crystal purity, proving unsuitable for stable use as crystals for FET.

In the light of the above-described circumstances, it has been demanded to produce a highly resistant crystal having a low residual carrier concentration without using a compensating dopant and to develop an FET using such a crystal as a buffer layer.

The inventors had previously conducted extensive studies to analyze causes why the epitaxial crystals prepared by vapor-phase growth using arsine do not have stable purity and are therefore unapplicable to devices requiring a high purity layer. As a result, it had been found that the donor impurity concentration in the epitaxial crystal is subject to great variation with lot-to-lot variation of the arsine source used as reported in *The 46th Ohyo Butsuri Gakkai Yokoshu*, 2a-E-3 (1985). According to the inventors, studies, when various crystal layers prepared using various arsine lots were applied to FET as a buffer layer on trial, crystals obtained from the most arsine lots turned out to be unsuitable for practical use. This means that, in using commercially available arsine, a deliberate choice should be made from various arsine lots before one can prepare a crystal having desired characteristics suited for use in FET with good reproducibility. Moreover, even if any chose may be determined, since arsine lots suitable for practical use are very few in number, it is difficult to produce a desired crystal on an industrial scale. Therefore, from the standpoint of industrialization of devices requiring high purity crystals, such as high-speed electronic devices including FET, it has been keenly demanded to stably supply arsine of improved purity and to develop a vapor-phase crystal growth method by the MOCVD method or hydride method using such high purity arsine.

Considering that the amount of impurities present in arsine is extremely small, stable supply of high purity arsine cannot be achieved unless one knows what and how much the impurities are with no analytical means available, what kinds of impurities are present, to what degree the impurities should be reduced, and how to purify the arsine source. However, it has been virtually impossible to solve these problems.

SUMMARY OF THE INVENTION

An object of this invention is to provide a vapor epitaxial growth method for industrially producing an epitaxial crystal of a Groups III-V compound semiconductor containing arsenic which has sufficient electron concentration and mobility for application to a device requiring a high purity crystal layer including a high-speed electronic device by using arsine having a sufficient purity as an arsenic source.

Another object of this invention is to provide a GaAs or $Al_xGa_{1-x}As$ (wherein $0<x$ 1) epitaxial crystal suitable as a buffer layer of a crystal for an FET, said epitaxial crystal being prepared by an MOCVD method and having incorporated thereinto no compensating impurity.

These and other objects and advantages of the present invention would be apparent through the description hereinafter given.

The present invention relates to a vapor epitaxial growth method for producing a Groups III-V compound semiconductor containing arsenic by vapor-phase growth using arsenic trihydride as an arsenic source, wherein said arsenic trihydride has a volatile impurity concentration of not more than 1.5 molppb on a germanium tetrahydride conversion.

The present invention further relates to an epitaxial crystal for an FET, which has a high resistance GaAs or $Al_xGa_{1-x}As$ (wherein $0x<1$) epitaxial crystal as a buffer layer, said GaAs or $Al_xGa_{1-x}As$ epitaxial crystal being prepared by an MOCVD method and having a carrier concentration of not more than $2\times10^{14}/cm^3$.

DETAILED DESCRIPTION OF THE INVENTION

The present invention will be illustrated with reference to an MOCVD method as an instance, but the present invention is not limited thereto.

Raw materials of the Group III which can be used in the present invention include a trialkylgallium, e.g., trimethylgallium and triethylgallium; a tri($C_1$-$C_4$)alkylaluminium, e.g., trimethylaluminum, triethylaluminum, and tributylaluminum; and a trialkylindium, e.g., trimethylindium and triethylindium, either individually or as a mixture thereof. Commercially available Group III materials have high purity causing no problem of purity of the resulting crystals and can hence be employed in the present invention.

The Group V raw material which can be used in the present invention is arsine containing a volatile impurity in a concentration of not more than 1.5 molppb, preferably not more than 0.2 molppb, on a germane conversion. If desired, arsine may be mixed with phosphine, antimony hydride (stibine), etc. This being the case, the gas to be mixed also should have a high purity.

Figure 1:
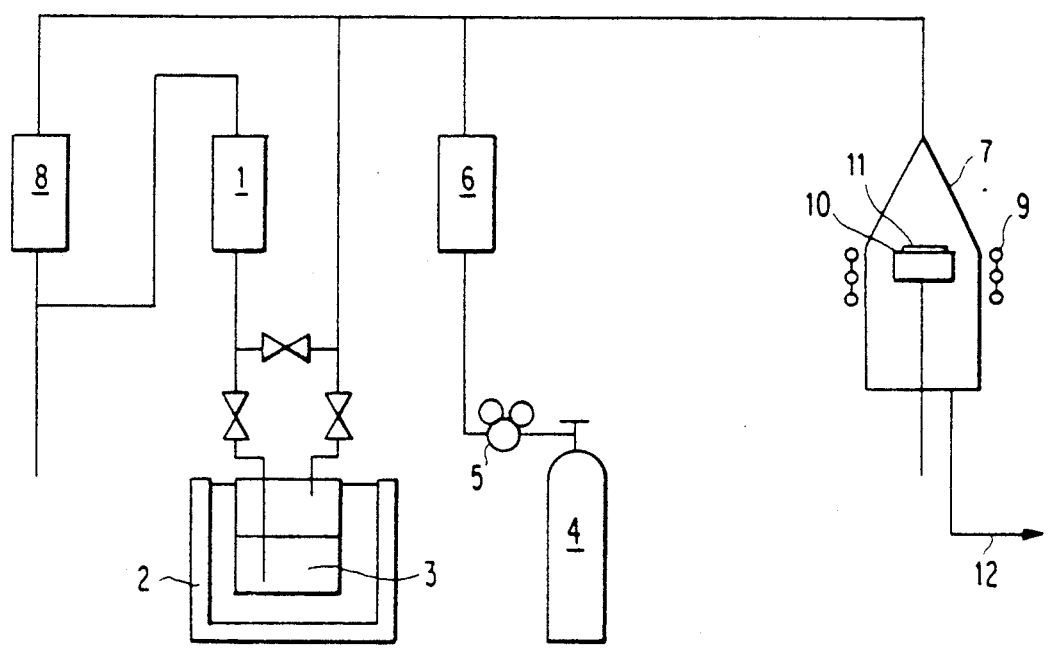
FIG. 1 illustrates a schematic view of an apparatus for vapor-phase growth which can be used in carrying out the method of the present invention.

FIG. 1 illustrates an example of an apparatus for vapor-phase growth of GaAs according to an MOCVD method. Embodiments of the present invention are now explained by referring to FIG. 1.

Carrier gas under flow control by mass flow controller 1 is forwarded to bubbler 3 under temperature control by thermostat 2, where the carrier gas is bubbled through a trialkylgallium in the bubbler 3 and then carried to reactor 7 together with trialkylgallium vapors. At this time, the amount of the trialkylgallium to be introduced is controlled to fall within the range usually of from $10^{-3}$ to $10^{-5}$ mol/min by adjusting the vapor pressure determined by the liquid temperature and the flow rate of the carrier gas to be bubbled.

On the other hand, arsine is usually charged in aluminum- or steel-made high pressure container 4. After pressure adjustment by means of reducing valve 5, arsine is introduced into the reactor 7 through mass flow controller 6 for flow rate adjustment. The amount of arsine to be introduced is generally from 5 to 200 times that of the gallium raw material. The arsine and trialkylgallium vapors are generally forwarded to the reactor 7 together with a carrier gas whose flow rate has been controlled by mass flow controller 8.

In the reactor 7 is placed graphite mount (susceptor) 10 which is subject to high-frequency heating by means of external coil 9 set around the reactor 7. On heating, the mixed gas of the raw material gases and the carrier gas is heat decomposed in the vicinity of substrate 11 mounted on the susceptor 10 to allow a GaAs epitaxial crystal to grow on the substrate 11. The exhaust gas after the reaction is discharged from exhaust port 12.

While the above example illustrates growth of GaAs, epitaxial crystals of a broad range of Groups III-V compound semiconductors containing arsenic can be obtained by supplying a trialkylaluminium, a trialkylindium, etc. in place of the trialkylgallium by the use of the same gas feeding mechanism as used above or by supplying phosphine, stibine, etc. in place of arsine by the use of the same gas feeding mechanism as used above.

Methods for analyzing impurities in crystals and in arsine gas from which the former arises are described below in detail.

GaAs was allowed to grow by epitaxy using the apparatus of FIG. 1 and commercially available arsine as an arsenic source. In using trimethylgallium as a gallium source, electrical characteristics of the resulting crystal layer vary depending on the arsine/trimethylgallium feed ratio. Namely, as far as the As/Ga ratio (arsine to trimethylgallium ratio) is small, the crystal layer is of P-type. According as the As/Ga ratio increases, the layer becomes an N-type, and the electron concentration monotonously increases with a further increase of As/Ga ratio. The As/Ga ratio at which the crystal changes from P-type to N-type varies depending on growth conditions and the raw material lot. With the growth conditions being appropriately fixed, such an As/Ga ratio substantially depends on the arsine lot used and is subject to variation between the range of from about 15 to 40 as hereinafter described. N-type crystals are usually obtained at an As/Ga ratio of 50. The acceptor impurity in these N-type crystals is known to be carbon arising from methyl groups of trimethylgallium as described in *Journal of Crystal Growth*, Vol. 68, pp. 148-156 (1984), and it is considered that the crystal becomes P-type predominantly because of increased incorporation of the carbon atoms into the crystal at a low As/Ga ratio. As the As/Ga ratio increases, the carbon acceptor decreases, and the crystal purity comes under government of a donor impurity, but the origin and composition of the donor impurity have been unclear.

Hence, the following analyses were conducted in order to find the impurity in N-type crystals rich in donor impurity. An N-type crystal (designated Sample A) was prepared using a certain arsine lot at a growth temperature of 650° C. and at an As/Ga ratio of 50. The electron concentration attributed to the residual donor impurity in Sample A was found to be $3.3 \times 10^{16}/cm^3$ by a capacitance-voltage (C-V) method. Then, impurity in Sample A was analyzed by secondary ion mass spectrometry. As a result, germanium, silicon, and sulfur out of the Groups IV and VI elements which are believed to act as donor impurities in GaAs were detected at concentrations of $2.3 \times 10^{16}/cm^3$, $0.6 \times 10^{16}/cm^3$, and $0.3 \times 10^{16}/cm^3$, respectively. From the fact that the sum of these concentrations is almost consistent with the residual electron concentration above obtained, it is assumed that the residual donor impurity in Sample A chiefly arises from germanium, silicon, and sulfur.

Further, samples differing in purity prepared using several different arsine lots were analyzed to find donor impurity by far infrared photo-conductivity spectrometry. As a result, even those samples of higher purity showed donor peaks assigned to germanium, silicon, and sulfur having a total intensity corresponding to the residual electron concentration. It was thus proved that the donor impurity arising from arsine always comprises germanium, silicon, and sulfur.

From these analytical results, it can be seen that a GaAs crystal grown using commercially available arsine contains germanium, silicon, and sulfur as a main donor impurity at a total concentration being almost consistent with the residual electron concentration in the crystal under certain fixed growth conditions and that the impurity arises from the impurity of arsine. However, impurity analyses of arsine by gas chromatography and infrared absorption spectrophotometry which have been conventionally employed for analyzing arsine failed to detect impurities corresponding to germanium, silicon, and sulfur probably because the amounts of these impurities are extremely low below the detection limits of these analytical methods. Since no definition for such traces of impurity has hitherto been proposed, a new definition of impurity in arsine which exerts influences on epitaxial crystals should be established before closer studies can be conducted.

Utilizing the facts that the residual electron concentration in a GaAs epitaxial crystal is sensitive to the impurity concentration under proper growth conditions and that electron concentrations can be measured with an extremely high sensitivity, the inventors have established a method for evaluating purity of arsine as follows. That is, GaAs growth conditions under which the impurity in arsine makes a large contribution to a residual electron concentration while other impurities make small contributions thereto were selected, and the electron concentration of a crystal grown under such conditions was measured to evaluate arsine purity.

Figure 2:
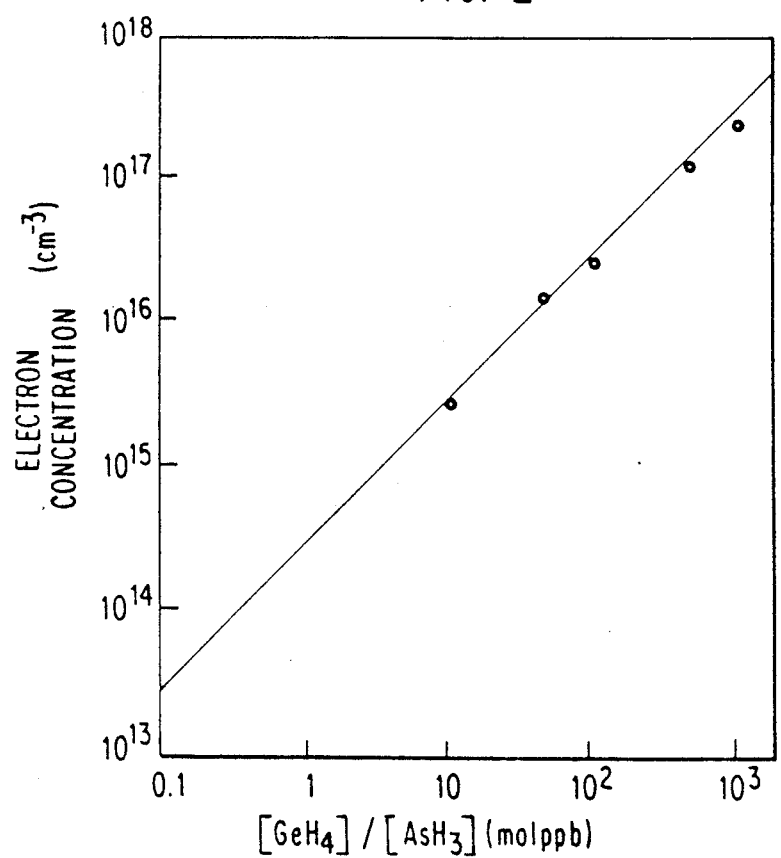
FIG. 2 depicts the relationship between germanium tetrahydride ($GeH_4$, hereinafter referred to as germane) in arsine gas and electron concentration in crystals.

Then, GaAs was allowed to undergo epitaxial growth using a number of commercially available arsine lots at present, and the residual electron concentration of each of the resulting epitaxial crystals was obtained by the C-V method. A concentration of the impurity in arsine was then to be estimated. Although it is assumed that the germanium, silicon and sulfur impurities in the crystal may probably have had a molecular form of hydride while in arsine, the actual state is still unknown. Hence, the inventors made it a rule to express the amount of the impurity in arsine as follows. Germane-doped GaAs crystals were prepared under the same growth conditions as specified above with a varied germane amount, and the amount of germane necessary to obtain the same electron concentration as the residual electron concentration in the crystal prepared using arsine under analysis was divided by the amount of arsine used. The quotient is taken as an indication of arsine purity (explained more specifically in Reference Example hereinafter described). An arsine lot from which a crystal having a relatively low electron concentration was obtained was chosen as a standard. GaAs was allowed to grow by epitaxy using the standard arsine while introducing a germane standard gas (diluted with hydrogen) having a known concentration as a dopant gas at a varied feed rate. The electron concentration of each of the resulting crystals was measured by the C-V method to give a substantially linear proportional relationship between the germane concentration in arsine and a difference between the residual electron concentration of the resulting crystal and that of the crystal obtained by using the standard arsine as shown in FIG. 2. By using this relationship as a calibration curve, an impurity concentration in a commercially available arsine lot under analysis on a germane conversion can be obtained from the residual electron concentration in the crystal prepared by using that arsine.

Figure 3:
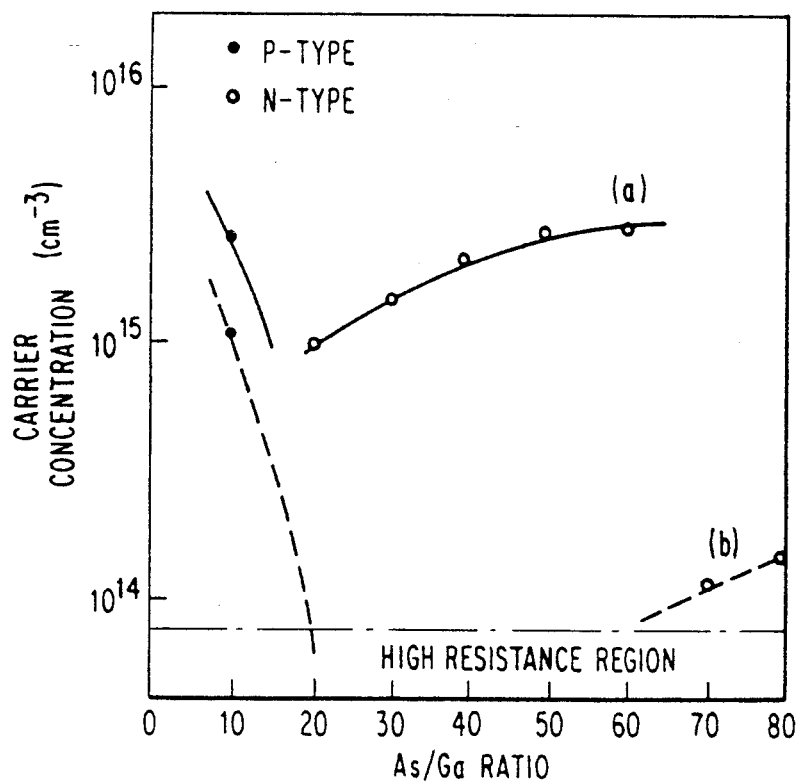
FIG. 3 depicts the relationship between residual electron concentration in crystals obtained by vapor-phase growth and As/Ga ratio while growth.

Further, characteristics of crystals prepared by using an arsine lot whose impurity concentration is known by the above-described method were closely examined to reveal the following facts. As explained above with respect to the analyses, a crystal prepared from a combination with trimethylgallium changes its electrical characteristics from P-type to N-type with a change of an As/Ga ratio (a quotient obtained by dividing an arsine feed by a trimethylgallium feed, hereinafter the same) during growth. With the change from P-type to N-type, the carrier concentration drastically decreases due to compensation between donor impurities and acceptor impurities. Accordingly, the change can be made use of in the production of a buffer layer of a crystal for a high-frequency FET or an active layer of a Gunn diode which requires be to a high-resistant layer having a carrier concentration of, for instance, not more than 1 to $2 \times 10^{14}/cm^3$. However, in using arsine having a high impurity concentration, for example, of 9.2 molppb on a germane conversion, the change from P-type to N-type of higher electron concentration suddenly took place in the vicinity of As/Ga=10 as shown in FIG. 3-(a). It was therefore difficult to obtain crystals having a carrier concentration of not more than $2 \times 10^{14}/cm^3$ with good reproducibility. On the other hand, where arsine of low impurity concentration was used, as shown in FIG. 3-(b), the As/Ga ratio causing the P-type to N-type change became higher and, also, the carrier concentration at around that As/Ga ratio became lower, thus making it easy to obtain a crystal of desired purity. This tendency becomes conspicuous according as the impurity concentration of arsine decreases. After experiments in more detail, it was proved that a high purity crystal having a residual electron concentration of not more than $2 \times 10^{14}/cm^3$ can be obtained with satisfactory reproducibility by properly controlling the As/Ga ratio according to the purity of arsine used as long as the arsine has an impurity concentration of not more than 1.5 molppb. It also turned out that where arsine used has an impurity concentration of not more than 0.2 molppb, a high purity crystal containing a reduced remaining impurity can be obtained with satisfactory reproducibility by selecting the As/Ga ratio from a broad range of from 20 to 80. From these results, it has now been ascertained that an arsine source to be used in obtaining high purity crystals applicable to high-speed electronic devices, such as FET and Gunn diodes must have an impurity concentration of not more than 1.5 molppb, and preferably not more than 0.2 molppb, on a germane conversion.

A method for preparing the above-described high purity arsine which can be used in vapor-phase growth according to the present invention is described below.

According to the inventors, studies, fractional distillation of arsine gives an initial boiling point fraction having a high impurity concentration while giving an end point fraction and a still residue each having a low impurity concentration. Therefore, arsine having a markedly reduced impurity can be obtained by recovering a high-boiling fraction or a still residue in general fractional distillation or batch distillation. High purity arsine can also be obtained by precise fractional distillation by means of a rectification tower using a packed column. Conditions for distillation are appropriately selected without any particularly limitation. Taking vapor pressure of arsine into consideration, it is usually preferable to conduct distillation under a pressure of from atmospheric pressure to 10 kg/cm$^2$G Thus, high purity arsine of desired purity as having a donor impurity concentration of not more than 1.5 molppb, and preferably not more than 0.2 molppb, on a germane conversion can be supplied in a stable manner irrespective of the purity of commercially available arsine lots, thus making it possible to stably obtain a high purity crystal applicable to an FET, a Gunn diode, etc. by vapor-phase growth.

While the foregoing explanation relates to growth of high purity GaAs by the MOCVD method, the same effects as described above can be produced when vapor-phase growth is carried out by a hydride method also using arsine as a raw material.

As described above, in vapor-phase growth of an epitaxial crystal of a Groups III-V compound semiconductor containing arsenic using arsine as an arsenic source, use of high purity arsine containing a volatile impurity containing germanium, silicon, and sulfur at a concentration of not more than 1.5 molppb on a germane conversion as an arsenic source makes it feasible to stably supply a high purity epitaxial crystal which can be applied to high-speed electronic devices including an FET. Thus, combined with the above-described method for supplying high purity arsine according to the present invention, the present invention is of great industrial significance.

The present invention is now illustrated in greater detail with reference to Reference Example, Examples, and Comparative Examples, but it should be understood that the present invention is not to be construed as being limited thereto.

REFERENCE EXAMPLE

An experiment was conducted as follows by the use of an apparatus for vapor-phase growth as shown in FIG. 1.

GaAs was allowed to grow on a substrate comprising a semi-insulating GaAs single crystal at a substrate temperature of 650° C. for 120 minutes while feeding $6.7 \times 10^{-5}$ mol/min of trimethylgallium, $3.35 \times 10^{-3}$ mol/min of commercially available arsine, and 15 l/min of a carrier hydrogen gas to obtain a 6 μm thick epitaxial GaAs crystal. Electrical characteristics of the resulting crystal were determined by the C-V method (at room temperature) and, as a result, the residual electron concentration was found to be $1.8 \times 10^{15}$/cm$^3$. Then, to the arsine used above was added a varied amount of germane standard gas (diluted with hydrogen) having a known concentration, and vapor-phase growth was carried out under the same conditions as described above but using each of the mixed gases having various germane concentrations shown in Table 1 below. The residual electron concentration of each of the resulting crystals was measured. A difference between the measured residual electron concentration and the residual electron concentration of the crystal obtained by using only arsine (i.e., $1.8 \times 10^{15}$/cm$^3$) is shown in Table 1. A plot of difference in residual electron concentration vs. germane concentration in the logarithmic expression gave a straight line as shown in FIG. 2 and proved usable as a calibration curve. In Examples and Comparative Examples hereinafter described, impurity concentrations of arsine on a germane conversion were obtained by using the calibration curve thus prepared.

TABLE 1

| GeH$_4$/AsH$_3$ (molppb) | Difference in Residual Electron Concentration (cm$^{-3}$) | Remarks |
| --- | --- | --- |
| 13 | $3.7 \times 10^{15}$ | 0.1 ppm GeH$_4$ was used. |
| 52 | $1.7 \times 10^{16}$ | 0.1 ppm GeH$_4$ was used. |
| 130 | $3.7 \times 10^{16}$ | 0.1 ppm GeH$_4$ was used. |
| 520 | $1.6 \times 10^{17}$ | 1.0 ppm GeH$_4$ was used. |
| 1300 | $3.3 \times 10^{17}$ | 1.0 ppm GeH$_4$ was used. |

EXAMPLE 1

(1) Purification of Arsine (a) A GaAs epitaxial crystal was allowed to grow on a semi-insulating GaAs single crystal substrate at a substrate temperature of 650° C. for 120 minutes by means of the apparatus shown in FIG. 1 by feeding $6.7 \times 10^{-5}$ mol/min of trimethylgallium, $3.35 \times 10^{15-3}$ mol/min of commercially available arsine and 15 l/min of a carrier hydrogen gas to obtain a 6 μm thick epitaxial GaAs crystal. Electrical characteristics of the resulting crystal were examined by Hall measurement using the Van der Pauw configuration and C-V measurement. As a result, the crystal was found to be of an N-type and to have an electron concentration of $2.4 \times 10^{15}$/cm$^3$ and an electron mobility of 7,400 cm$^2$/V. sec at room temperature. From the electron concentration thus measured in view of the calibration curve of FIG. 2, the impurity concentration in the arsine was found to be 8.0 molppb on a germane conversion.

(b) About 1 kg of the above arsine was subjected to batch distillation under a pressure of 0.5 kg/cm$^2$G to obtain a still residue weighing 232 g.

Epitaxial growth of GaAs was carried out in the same manner as in (a) above but using the thus purified arsine as an arsenic source, and the electron concentration of the resulting crystal was measured. As a result, the purified arsine was found to have an impurity concentration of 0.14 molppb on a germane conversion.

(2) Crystal Growth

Figure 4:
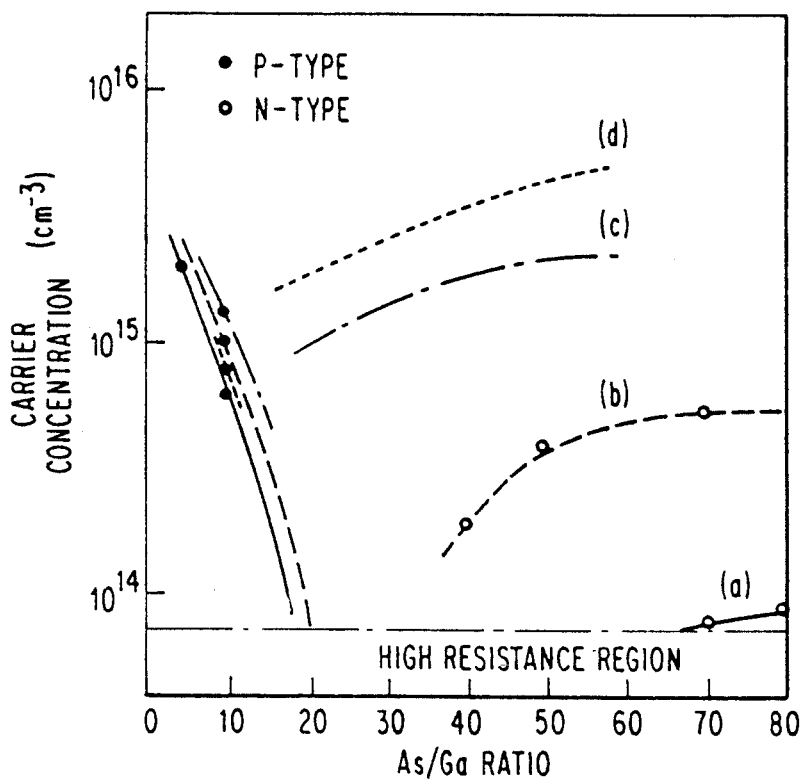
FIG. 4 depicts the relationship between carrier concentration in crystals obtained in Examples and Comparative Examples and As/Ga ratio.

Crystal growth on a semi-insulating GaAs single crystal substrate was carried out at a substrate temperature of 650° C. for 120 minutes by means of the apparatus of FIG. 1 by feeding $6.7 \times 10^{-5}$ mol/min of trimethylgallium, $6.7 \times 10^{-4}$ to $5.4 \times 10^{-3}$ mol/min (corresponding to an As/Ga ratio of from 10 to 80) of the purified arsine as obtained in (1)-(b) above (impurity concentration: 0.14 molppb on a germane conversion), and 15 μ/min of a carrier hydrogen gas to obtain a 6 μm thick epitaxial crystal. Evaluation of the electrical characteristics of each of the resulting crystals revealed a relationship between the residual carrier concentration of each crystal and the As/Ga ratio during growth as shown in FIG. 4-(a). The conduction type of the resulting crystals changed at an As/Ga ratio of about 50. Within an As/Ga ratio of from 20 to 80, the carrier concentration was $1 \times 10^{14}$/cm$^3$ or less, indicating that the crystals had a high purity suited for use in high-speed semiconductor devices.

(3) Crystal Growth for FET and Evaluation (a) An apparatus shown in FIG. 1 which additionally comprised a means for supplying monosilane (silicon tetrahydride) diluted with hydrogen to 20 molppm (the mechanism was the same as in the arsine feeder) was employed. Crystal growth on a semi-insulating GaAs single crystal substrate was carried out at a substrate temperature of 650° C. by feeding $6.7 \times 10^{-5}$ mol/min of trimethylgallium, from 1.4 to $3.4 \times 10^{-4}$ mol/min of the purified arsine as obtained in (1)-(b) (corresponding to an As/Ga of from 20 to 50), and 15 l/min of a carrier hydrogen gas to form a non-doped GaAs layer having a thickness of.3 μm. Then, $8.9 \times 10^{-8}$ mol/min of monosilane was subsequently fed for doping to grow an N-type layer to a thickness of 0.5 μm. As a result of Hall measurement of each of the resulting samples at room temperature, the electron mobility and the sheet carrier concentration were 3,900 cm$^2$/V.sec and $5 \times 10^{12}$/cm$^2$, respectively, irrespective of the arsine feed rate.

(b) Each of the samples was subjected to etching to a depth of about 0.6 βm while leaving the electrode portion thereof unetched to remove the N-type doped layer. The remaining non-doped GaAs layer was found to have a resistivity of $1 \times 10^3$ ohm.cm or more, proving to have a satisfactory resistivity.

Figure 5:
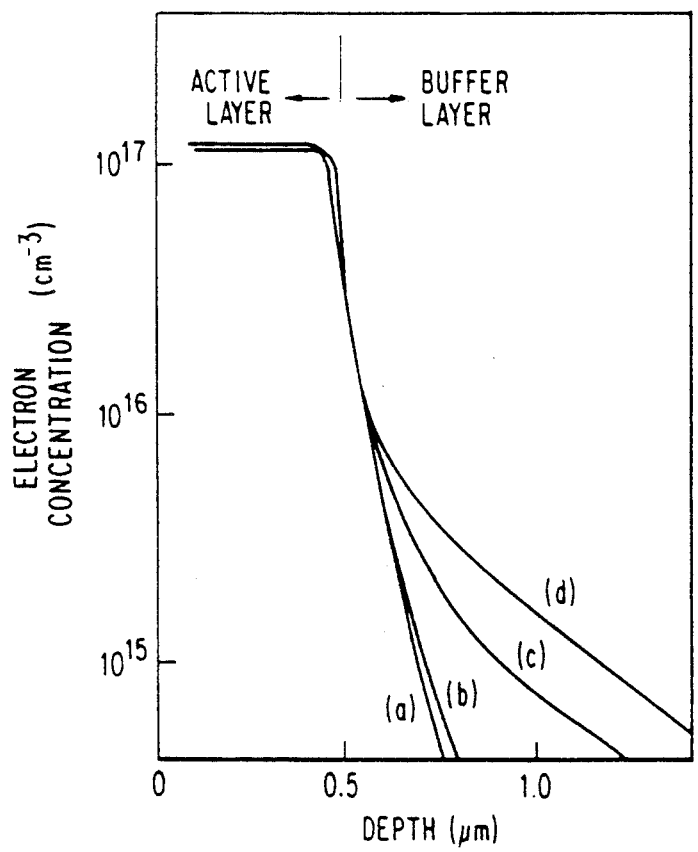
FIG. 5 depicts a carrier concentration profile in the depth direction of crystals obtained in Examples and Comparative Examples.

(c) An electron concentration profile of each sample was determined by the C-V method to obtain a satisfactory profile as shown in FIG. 5-(a).

Figure 6:
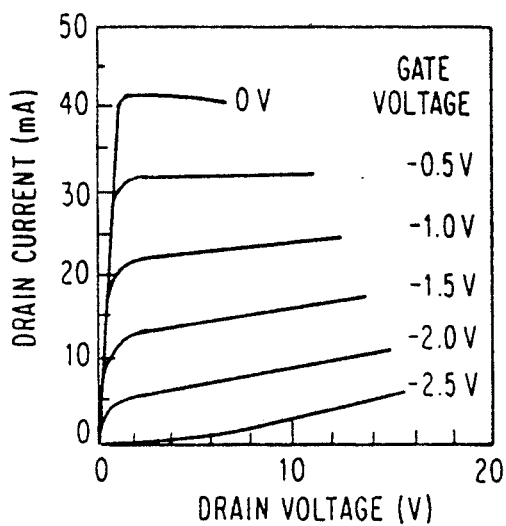
FIGS. 6 through 9 each shows static characteristics at room temperature of a recess gate type FET having a gate length of 1 $\mu$m obtained in Examples and Comparative Examples (abscissa: drain voltage; ordinate: drain current).

(d) A recess gate type FET having a gate length of 1 μm and a gate width of 250 μm was prepared by using the above obtained crystal. Determination of static characteristics of the resulting FET gave satisfactory results as shown in FIG. 6 with drain voltage (Vds: 2 V/div.) as abscissa and drain current (Ids: 5 mA/div.) as ordinate. As a parameter (Vgs), the gate voltage was varied by a 500 mV step.

(e) The gate electrode was removed from the FET, and a groove of 0.6 μm deep and 5 μm width was made between the source electrode and the drain electrode (about 10 μm apart). A drain-source leakage current was measured. The leakage current on application of 10 V was $2.5 \times 10^{-9}$ A.

It can be seen from these results that a high purity GaAs crystal suitable for use in an FET for high-frequency amplification can be obtained when purified arsine having an impurity concentration of 0.14 molppb on a germane conversion is used as an arsenic source.

EXAMPLE 2

(1) Purification of Arsine (a) A commercially available arsine lot different from that used in Example 1 was analyzed in the same manner as in Example 1. As a result, it had an impurity concentration of 15.2 molppb on a germane conversion.

(b) About 1 kg of the above arsine was subjected to batch distillation in the same manner as in Example 1-(b). Epitaxial growth of GaAs was carried out in the same manner as in Example 1-(a) but using the thus purified arsine to find that the purified arsine had an impurity concentration of 1.4 molppb on a germane conversion.

(2) Crystal Growth

Crystal growth was carried out in the same manner as in Example 1-(2), except for using the purified arsine (impurity concentration: 1.4 molppb on a germane conversion). Evaluation of electrical characteristics of the resulting crystal gave the relationship of residual carrier concentration vs. As/Ga ratio as shown in FIG. 4-(b). The conduction type of the resulting crystal changed at an As/Ga ratio of about 20. Within an As/Ga ratio of from 20 to 40, the crystal had a carrier concentration was not more than $2 \times 10^{14}/cm^3$, proving to have a high purity suitable for use in high-speed semiconductor devices.

(3) Crystal Growth for FET and Evaluation (a) An apparatus shown in FIG. 1 which additionally comprised a means for supplying monosilane diluted with hydrogen to 20 molppm (the mechanism was the same as in the arsine feeder) was employed. Crystal growth on a semiinsulating GaAs single crystal substrate was carried out at a substrate temperature of 650° C. by feeding $6.7 \times 10^{-5}$ mol/min of trimethylgallium, from 1.4 to $3.4 \times 10^{-4}$ mol/min of the purified arsine as obtained in (1)-(b) above (corresponding to an As/Ga of from 20 to 50), and 15 l/min of a carrier hydrogen gas to form a non-doped GaAs layer having a thickness of 3 μm. Then, $8.9 \times 10^{-8}$ mol/min of monosilane was subsequently fed for doping to grow an N-type layer to a thickness of 0.5 μm. As a result of Hall measurement of each of the resulting samples at room temperature, the electron mobility and the sheet carrier concentration were 3,900 $cm^2/V.sec$ and $5 \times 10^{12}/cm^3$, respectively, irrespective of the arsine feed rate.

(b) Each of the samples was subjected to etching to a depth of about 0.6 μm while leaving the electrode portion thereof unetched to remove the N-type doped layer. The remaining non-doped GaAs layer of each of the samples prepared at an As/Ga ratio of from 20 to 30 was found to have a resistivity of $1 \times 10^3$ ohm.cm or more, proving to have a satisfactory resistivity. The resistivity of those samples prepared at a higher As/Ga ratio was from 1 to 100 ohm.cm.

(c) An electron concentration profile of each sample prepared at an As/Ga ratio of from 20 to 30 was determined by the C-V method to obtain a satisfactory profile as shown in FIG. 5-(b).

Figure 7:
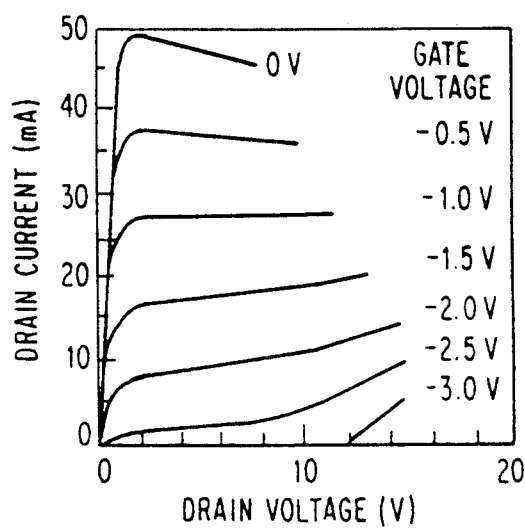

(d) A recess gate type FET having a gate length of 1 μm and a gate width of 250 μm was prepared by using the crystal obtained at an As/Ga ratio of from 20 to 30. Static characteristics of the resulting FET were determined in the same manner as in Example 1-(d) to obtain satisfactory results as shown in FIG. 7.

(e) The gate electrode was removed from the FET, and a groove of 0.6 μm deep and 5 μm width was made between the source electrode and the drain electrode (about 10 μm apart). A drain-source leakage current was measured. The leakage current on application of 10 V was 1 to $3 \times 10^{-8}$ A.

It can be seen from these results that a high purity GaAs crystal suitable for use in an FET for high-frequency amplification can be obtained when purified arsine having an impurity concentration of 1.4 molppb on a germane conversion is used as an arsenic source.

COMPARATIVE EXAMPLE 1

(1) Crystal Growth

Crystal growth was carried out in the same manner as in Example 1-(2), except for using the same commercially available unpurified arsine as used in Example 1-(1) (impurity concentration: 8.0 molppb on a germane conversion). Evaluation of electrical characteristics of the resulting crystal gave the relationship of residual carrier concentration vs. As/Ga ratio as shown in FIG. 4-(c). The conduction type of the crystal changed from P-type to N-type at an As/Ga ratio of around 10, and the minimum carrier concentration was $1 \times 10^{15}/cm^3$.

(2) Crystal Growth for FET and Evaluation (a) Crystal growth was carried out in the same manner as in Example 1-(3), except for using the same commercially available unpurified arsine (impurity concentration: 8.0 molppb on a germane conversion). As a result of Hall measurement at room temperature, the resulting crystal was found to have an electron mobility of 3,900 $cm^2/V.sec$ and a sheet carrier concentration of $5 \times 10^{12}/cm^3$ irrespective of the arsine feed.

(b) The sample was subjected to etching to a depth of about 0.6 μm while leaving the electrode portion thereof unetched to remove the N-type doped layer. The remaining non-doped GaAs layer was found to have a resistivity of 1 to 100 ohm.cm.

(c) An electron concentration profile of each sample prepared at an As/Ga ratio of from 20 to 30 was determined by the C-V method, and the results are shown in FIG. 5-(c). It can be seen that a part of the samples showed a satisfactory profile, whereas other samples revealed a shoulder of about $1 \times 10^{15}/cm^3$ in the buffer layer thereof.

Figure 8:
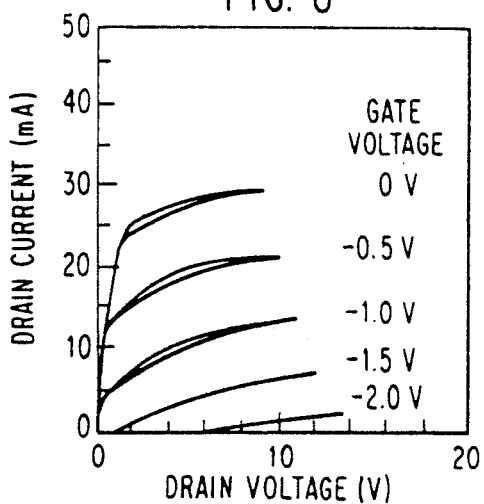

(d) A recess gate type FET having a gate length of 1 μm and a gate width of 250 μm was prepared by using each of the crystals obtained at an As/Ga ratio of from 20 to 30. Static characteristics of the resulting FET were determined in the same manner as in Example 1-(d), and the results are shown in FIG. 8. It can be seen that the FET exhibited slightly deteriorated pinch-off characteristics, which are believed to be ascribed to current leakage in the buffer layer.

(e) The gate electrode was removed from the FET, and a groove of 0.6 μm deep and 5 μm width was made between the source electrode and the drain electrode (about 10 μm apart). A drain-source leakage current was measured. The leakage current on application of 10 V was $1 \times 10^{-4}$ to $3 \times 10^{-5}$ A.

These results show difficulty of obtaining a high purity crystal applicable to an FET, etc. with the arsine as employed.

COMPARATIVE EXAMPLE 2

(1) Crystal Growth

Crystal growth was carried out in the same manner as in Example 1-(2), except for using the same commercially available unpurified arsine as used in Example 2-(1) (impurity concentration: 15.2 molppb on a germane conversion). Evaluation of electrical characteristics of the resulting crystal gave the relationship of residual carrier concentration vs. As/Ga ratio as shown in FIG. 4-($d$). The conduction type of the crystal changed from P-type to N-type at an As/Ga ratio of around 10, and the minimum carrier concentration was $2 \times 10^{15}/cm^3$.

(2) Crystal Growth for FET and Evaluation (a) Crystal growth was carried out in the same manner as in Example 2, except for using the same commercially available unpurified arsine as used in Example 2 (impurity concentration: 15.2 molppb on a germane conversion). As a result of Hall measurement at room temperature, the resulting crystal was found to have an electron mobility of 3,900 $cm^2/V.sec$ and a sheet carrier concentration of $5 \times 10^{12}/cm^3$ irrespective of the arsine feed.

(b) The sample was subjected to etching to a depth of about 0.6 $\mu m$ while leaving the electrode portion thereof unetched to remove the N-type doped layer. The remaining nondoped GaAs layer was found to have a resistivity of 1 to 100 ohm.cm.

(c) An electron concentration profile of each sample prepared at an As/Ga ratio of from 20 to 30 was determined by the C-V method, and the results are shown in FIG. 5-($d$). It can be seen that a part of the samples showed a satisfactory profile, whereas other samples revealed a shoulder of about 1 to $2 \times 10^{15}/cm^3$.

Figure 9:
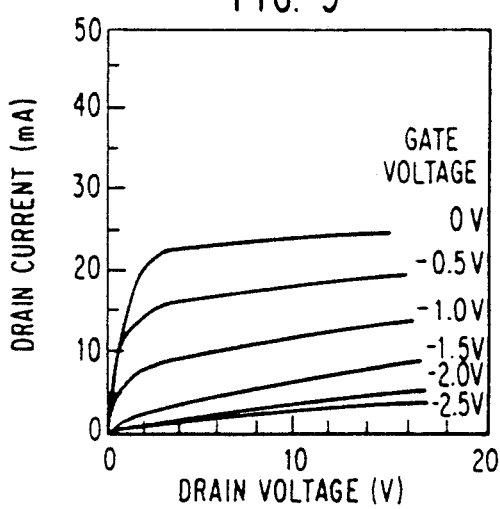

(d) A recess gate type FET having a gate length of 1 $\mu m$ and a gate width of 250 $\mu m$ was prepared by using each of the crystals obtained at an As/Ga ratio of from 20 to 30. Static characteristics of the resulting FET were determined in the same manner as in Example 1-(d), and the results are shown in FIG. 9. It can be seen that the FET exhibited slightly deteriorated pinch-off characteristics, which are believed to be ascribed to current leakage in the buffer layer.

(e) The gate electrode was removed from the FET, and a groove of 0.6 $\mu m$ deep and 5 $\mu m$ width was made between the source electrode and the drain electrode (about 10 $\mu m$ apart). A drain-source leakage current was measured. The leakage current on application of 10 V was $1 \times 10^{-3}$ to $6 \times 10^{-5}$ A.

These results show difficulty of obtaining a high purity crystal applicable to an FET, etc. with the arsine as employed.

EXAMPLE 3

A commercially available arsine lot was analyzed in the same manner as in Example 1-(1) to find that the impurity concentration thereof was 6.7 molppb. This arsine was purified under the same conditions as in Example 1-(1). The impurity concentration of the thus purified arsine was found to be 0.16 molppb.

A crystal for an HEMT was prepared using the purified arsine and evaluated as follows.

Crystal growth was carried out at a substrate temperature of 650° C. by feeding $2.7 \times 10^{-5}$ mol/min of trimethylgallium, 15 l/min of a carrier hydrogen gas, and arsine at a feed rate corresponding to an As/Ga ratio of 50 for 25 minutes to grow non-doped GaAs (thickness: 5,000 Å). Then, trimethylaluminum was additionally fed for $6.8 \times a o^{31\ 6}$ mol/min of 5 seconds to grow non-doped AlGaAs (thickness: 20 Å). Subsequently, $8.9 \times 10^{-8}$ mol/min of monosilane was additionally fed for 2 minutes to grow N-type AlGaAs (thickness: 500Å). Finally, the trimethylaluminum feed was stopped, and N-type GaAs was allowed to growth for 7.5 minutes (thickness: 1,500 Å).

The N-type GaAs layer (uppermost layer) of the resulting crystal was removed by etching, and Hall measurement was conducted. As a result, the sheet carrier concentration and electron mobility at 77 K were found to be 1.0 to $1.1 \times 10^{12}/cm^2$ and 40,000 to 42,000 $cm^2/V.sec$, respectively.

Figure 10:
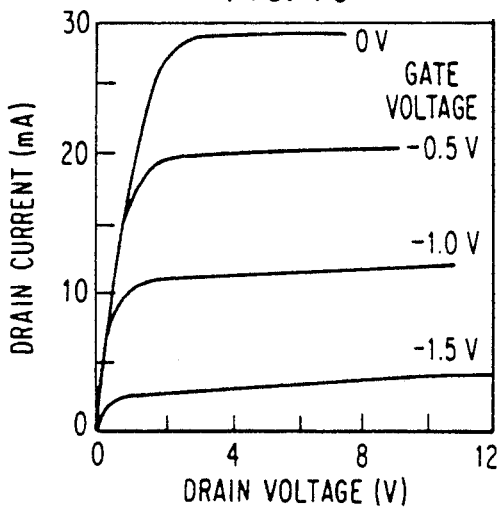
FIGS. 10 and 11 each shows static characteristics of an FET having a gate length of 1 $\mu$m and using a selectively doped epitaxial crystal obtained in Examples and Comparative Examples (abscissa: drain voltage; ordinate: drain current).
Figure 11:
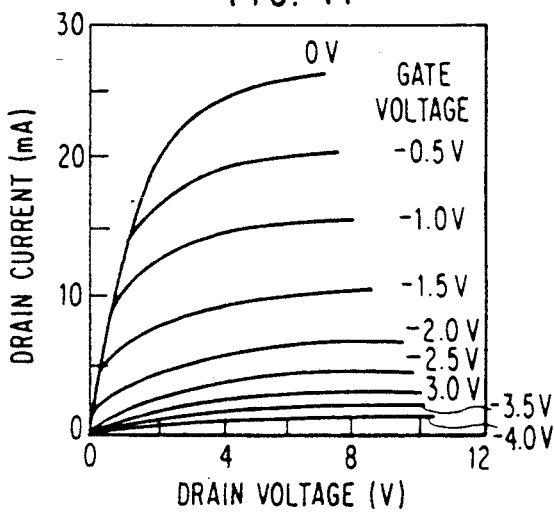

An FET having a gate length of 1 $\mu m$ was prepared in the same manner as in Example 1-(d), except for using the above obtained crystal. Determination of static characteristics of the resulting FET gave satisfactory results as shown in FIG. 10.

COMPARATIVE EXAMPLE 3

Crystal Growth was carried out in the same manner as in Example 3, except for using the same commercially available arsine having an impurity concentration of 6.7 molppb as used in Example 3. As a result of Hall measurement, the crystal had a sheet carrier concentration of 1.1 to $1.2 \times 10^{12}/cm^2$ and an electron mobility at 77 K of 33,000 to 37,000 $cm^2/V.sec$.

Then, an FET having a gate length of 1 $\mu m$ was prepared in the same manner as in Example 1-(d), except for using the above obtained crystal. Determination of static characteristics of the resulting FET revealed deterioration of pinch-off characteristics and reduction of mutual conductance at a high gate bias.

Figure 12:
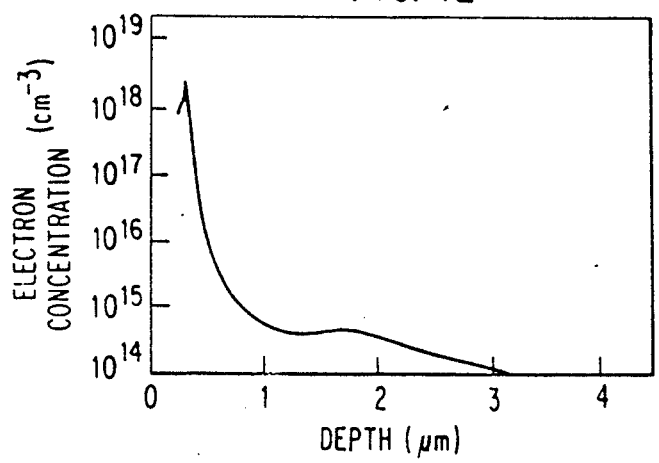
FIG. 12 shows an electron concentration profile in the depth direction of the selectively doped epitaxial crystal obtained in Comparative Example 3.

The carrier concentration profile of the crystal was obtained by the C-V method. As shown in FIG. 12, a shoulder of carrier concentration which is considered ascribable to impurity of the buffer layer was observed.

While the invention has been described in detail and with reference to specific embodiments thereof, it will be apparent to one skilled in the art that various changes and modifications can be made therein without departing from the spirit and scope thereof.

What is claimed is:

1. A vapor-phase epitaxial growth method for producing a Groups III-V compound semiconductor containing arsenic by vapor-phase epitaxial growth using arsenic trihydride as an arsenic source, wherein said arsenic trihydride has a volatile impurity concentration of not more than 1.5 molppb on a germanium tetrahydride conversion.

2. A vapor-phase epitaxial growth method as claimed in claim 1, wherein said arsenic trihydride has a volatile impurity concentration of not more than 0.2 molppb on a germanium tetrahydride conversion.

3. A vapor-phase epitaxial growth method as claimed in claim 1 wherein the growth is carried out using a trialkylgallium as a source of the Group III element.

4. A vapor-phase epitaxial growth method as claimed in claim 1, wherein the growth is carried out using a trialkylgallium and a trialkylaluminum as a source of the Group III element.

* * * * *